(12) United States Patent
Booth et al.

(10) Patent No.: US 8,164,499 B1
(45) Date of Patent: Apr. 24, 2012

(54) SHARED-ARRAY MULTIPLE-OUTPUT DIGITAL-TO-ANALOG CONVERTER

(75) Inventors: Richard Booth, Riegelsville, PA (US); Paulius Mosinskis, Richlandtown, PA (US); Phillip Johnson, Hellertown, PA (US); David Onimus, Drexel Hill, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 59 days.

(21) Appl. No.: 12/813,540

(22) Filed: Jun. 11, 2010

(51) Int. Cl.
  *H03M 1/00* (2006.01)
(52) U.S. Cl. ............... 341/135; 338/309; 341/144
(58) Field of Classification Search ............ 341/130–160
  See application file for complete search history.

(56) References Cited

U.S. PATENT DOCUMENTS

| | | |
|---|---|---|
| 5,703,587 A | 12/1997 | Clark et al. |
| 6,166,620 A * | 12/2000 | Inuzuka et al. ............ 338/309 |
| 6,703,956 B1 * | 3/2004 | Mueller et al. ............ 341/145 |
| 6,950,047 B1 | 9/2005 | Piasecki et al. |
| 7,042,972 B2 | 5/2006 | Fahim |

* cited by examiner

*Primary Examiner* — Lam T Mai
(74) *Attorney, Agent, or Firm* — Mendelsohn, Drucker & Associates, P.C.

(57) ABSTRACT

In an exemplary decision-feedback equalizer (DFE) of a serializer/deserializer (SerDes) receiver, a single current mirror array is shared by multiple current digital-to-analog converter (IDAC) functions. The DFE has an initial amplifier stage that applies an initial coefficient COEFF0 to an input data signal and a number of (e.g., five) additional amplifier stages that apply additional coefficients (e.g., COEFF1-COEFF5) to different delayed versions of the recovered output data stream. The outputs of the initial and multiple additional amplifier stages are summed to generate an equalized data signal that is applied to a clock-and-data recovery (CDR) circuit. Due to certain characteristics of the equalizer function, the multiple additional amplifier stages can be implemented using a single shared current mirror array, which save significant amounts of chip area compared to conventional implementations in which each additional amplifier stage has its own dedicated current mirror array.

12 Claims, 6 Drawing Sheets

SHARED-ARRAY MULTIPLE-OUTPUT DIGITAL-TO-ANALOG CONVERTER

BACKGROUND

1. Field of the Invention

The present invention relates to electronics and, more specifically, to digital-to-analog converters.

2. Description of the Related Art

This section introduces aspects that may help facilitate a better understanding of the invention. Accordingly, the statements of this section are to be read in this light and are not to be understood as admissions about what is prior art or what is not prior art.

A single array-based integrated circuit (IC) current digital-to-analog converter (IDAC) can utilize a relatively large amount of chip area since each bit of the array should be large enough to reproduce a replica input current with sufficient accuracy, such that each transistor in a bit supports the output current within the operating-point constraints of the output circuit. Also, device matching is improved with increasing device area. Some IC applications involve multiple, different IDAC operations. Implementing such circuitry using multiple, independent IDAC circuits can be prohibitively expensive in terms of the required amount of chip area.

SUMMARY

In certain embodiments, the present invention is an integrated circuit having two or more different digital-to-analog converter (DAC) functions, wherein the integrated circuit comprises an element array that is shared by the two or more different DAC functions. In one embodiment in which the DAC functions are current DAC (IDAC) functions, the element array is a current mirror array.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
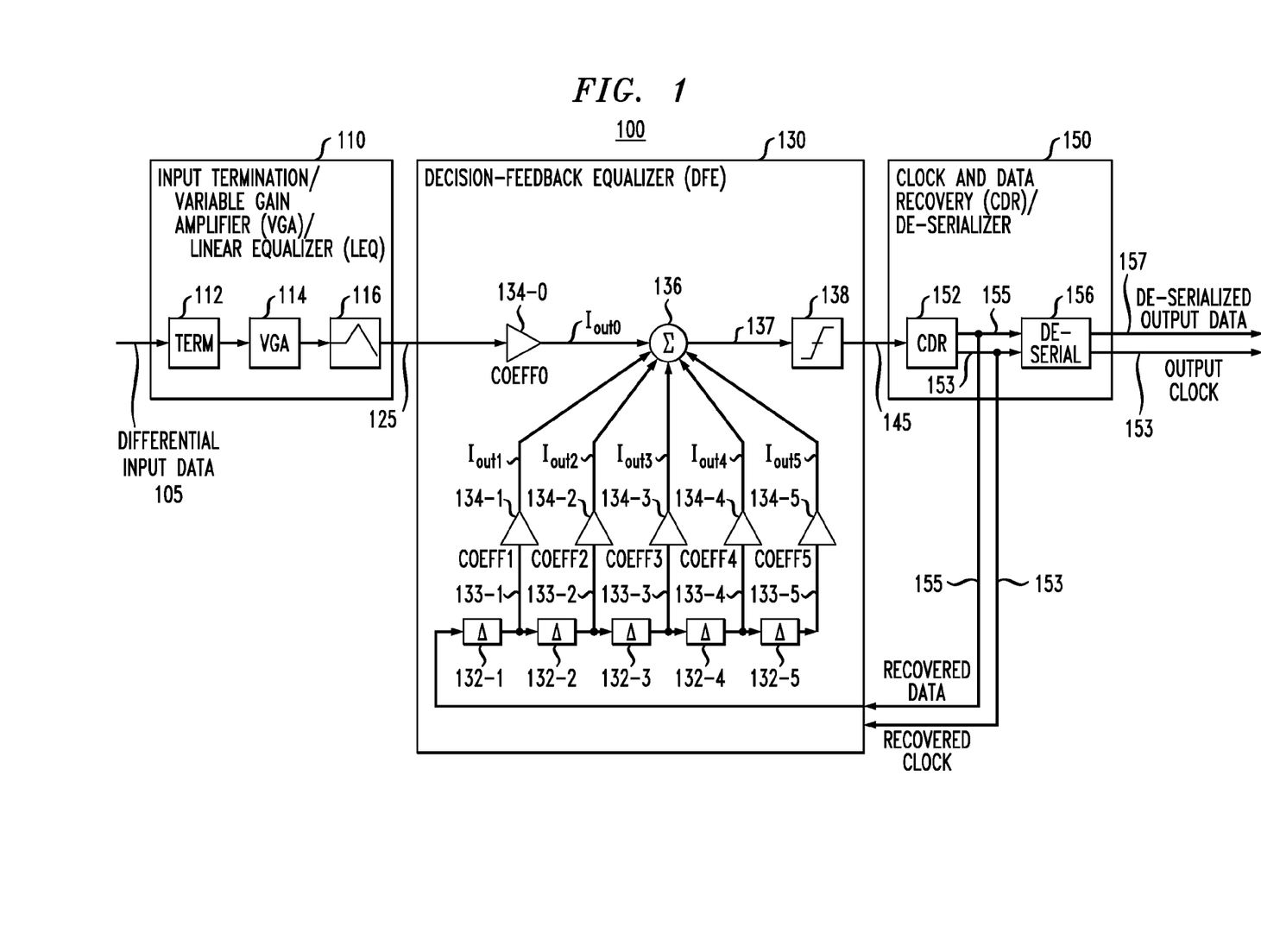
FIG. 1 shows a high-level block diagram of an exemplary serializer-deserializer (SerDes) receiver.

FIG. 1 shows a high-level block diagram of an exemplary serializer-deserializer (SerDes) receiver 100 that is part of an integrated circuit, such as (but not limited to) a field-programmable gate array (FPGA). SerDes receiver 100 receives serial, analog, differential input data signal 105, which has been transmitted through a (typically) corrupting communication channel, such as a long back-plane or a cable. SerDes receiver 100 processes the input data signal to generate recovered, deserialized (i.e., parallel), digital, output data streams 157 and recovered clock signal 153.

As shown in FIG. 1, SerDes receiver 100 includes analog front end (AFE) circuitry 110, decision-feedback equalizer (DFE) 130, and clock-and-data recovery (CDR) deserializer 150. AFE circuitry 110 includes termination circuitry 112 that provides input termination and AC decoupling, variable gain amplifier (VGA) 114 that provides signal amplification, and linear equalizer 116 that equalizes the input signal by emphasizing high-frequency components of the input signal that have been reduced by the low-pass aspect of the communication channel. Note that VGA 114 may be embedded in an automatic gain control (AGC) circuit (not shown in FIG. 1).

DFE equalizer 130 further and more effectively equalizes the input signal before application to CDR deserializer 150. DFE equalizer 130 has a series of five delay circuits 132-1 to 132-5 that generate five sequentially incrementally delayed versions 133-1 to 133-5 of the recovered serial data stream 155 (generated by CDR deserializer 150). DFE equalizer 130 also has six amplifier stages 134-0 to 134-5, where the initial amplifier stage 134-0 amplifies (i.e., multiplies) the input data stream 125 from AFE circuitry 110 based on the value of an initial coefficient COEFF0, and each of the five additional amplifier stages 134-1 to 134-5 receives a different delayed version 133-$i$ of the recovered serial data stream 155 output from a corresponding delay circuit 132-$i$ and multiplies that received delayed data stream based on the value of the corresponding coefficient COEFFi. The output from each amplifier stage 134-$i$ is current signal Iouti, where all six current signals are summed at summation node 136 to generate equalized analog data signal 137.

Not shown in FIG. 1 is a controller that sets the values of the coefficients COEFF0-COEFF5. Depending on the implementation, these values may be static (where they are set to fixed values based on a priori knowledge of the characteristics of the communication channel) or dynamic (where the controller determines and possibly updates the coefficient values based on real-time data processing). In that latter case, the controller would perform an adaptation algorithm that desirably steers the equalizer coefficient values such that the data eye reaching CDR deserializer 150 is maximally open.

DFE equalizer 130 also includes slicer 138, which slices equalized analog data signal 137 from summation node 136 into a binary serial data stream 145 for application to CDR deserializer 150.

CDR deserializer 150 includes CDR circuit 152 and deserializer 156. CDR circuit 152 derives clock signal 153 and serial data signal 155 from the sliced data signal 145 generated by slicer 138, and deserializer 156 converts serial data signal 155 into a number of parallel, output data streams 157.

Figure 2:
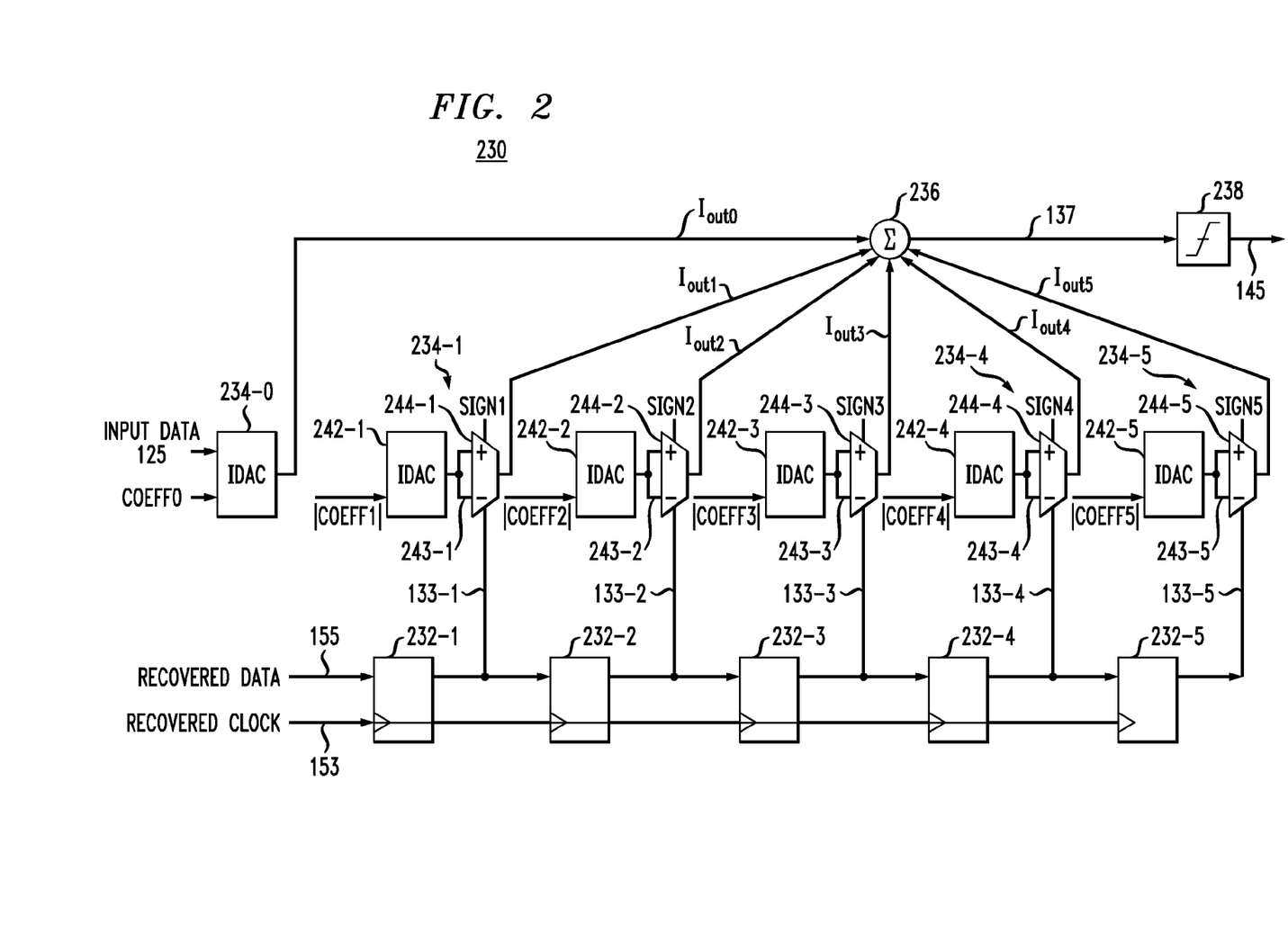
FIG. 2 shows one possible DFE equalizer that can be used to implement the DFE equalizer of FIG. 1.

FIG. 2 shows one possible DFE equalizer 230 that can be used to implement DFE equalizer 130 of FIG. 1. In DFE equalizer 230, delay circuits 132-1 to 132-5 of FIG. 1 are implemented by flip-flops 232-1 to 232-5, initial amplifier stage 134-0 of FIG. 1 is implemented by initial IDAC 234-0, summation node 136 of FIG. 1 is implemented by summation node 236, and slicer 138 of FIG. 1 is implemented by slicer 238. Furthermore, in DFE equalizer 230, each of the additional amplifier stages 134-1 to 134-5 is implemented by a different, independent, additional amplifier stage 234-$i$ consisting of a dedicated IDAC 242-$i$ and a dedicated multiplexer (mux) 244-$i$.

For each additional amplifier stage 234-$i$, IDAC 242-$i$ generates a positive current signal 243-$i$ whose magnitude is proportional to the magnitude of corresponding coefficient COEFFi. Mux 244-i receives the current signal 243-i from IDAC 242-i as its input as well as two control signals: the sign SIGNi of the coefficient COEFFi and the current (i.e., instant) bit of the delayed recovered data signal 133-i from the corresponding delay circuit 232-i. Mux 244-i outputs a current signal Iouti that is either the positive or negative version of the current signal 243-i received from IDAC 242-i depending on the values of the two control signals SIGNi and 133-i according to the following Table I.

TABLE I

MUX LOGIC

| Sign of COEFFi (SIGNi) | Bit Value (133-i) | Output Current Version (Iou/i) |
|---|---|---|
| Positive | 1 | Positive |
| Positive | 0 | Negative |
| Negative | 1 | Negative |
| Negative | 0 | Positive |

Summation node 236 can be implemented using a current-mode logic (CML) cell with currents Iout1-Iout5 drawn from either positive or negative (resistor) outputs. Muxes 244-1 to 244-5 are stacks of switches that allow current to come from one side or the other.

In DFE equalizer 230 of FIG. 2, the coefficient weights are digital words that are converted to analog currents by IDACs 242-i. In a typical SerDes application, one or more of the additional IDAC outputs 243-i are close to zero. In this case, much of the area used to implement the different, independent IDAC circuits 242-i is wasted, since most of them contribute little to the output of the DFE equalizer 230. Each additional coefficient incurs significant area costs. It is also the case, in a typical SerDes application, that the maximum value of the sum of all of the IDAC currents Iout1-Iout5 corresponding to the delayed data is constrained not to exceed the IDAC current Iout0 corresponding to the undelayed data. Based on these characteristics, according to certain embodiments of the present invention, the IDAC functions associated with coefficients COEFF1, . . . , COEFF5 share a single array of current mirror cells, resulting in significant savings in terms of chip area as compared to designs, such as that shown in FIG. 2, which implement different, independent IDAC circuits for each IDAC function.

Figure 3:
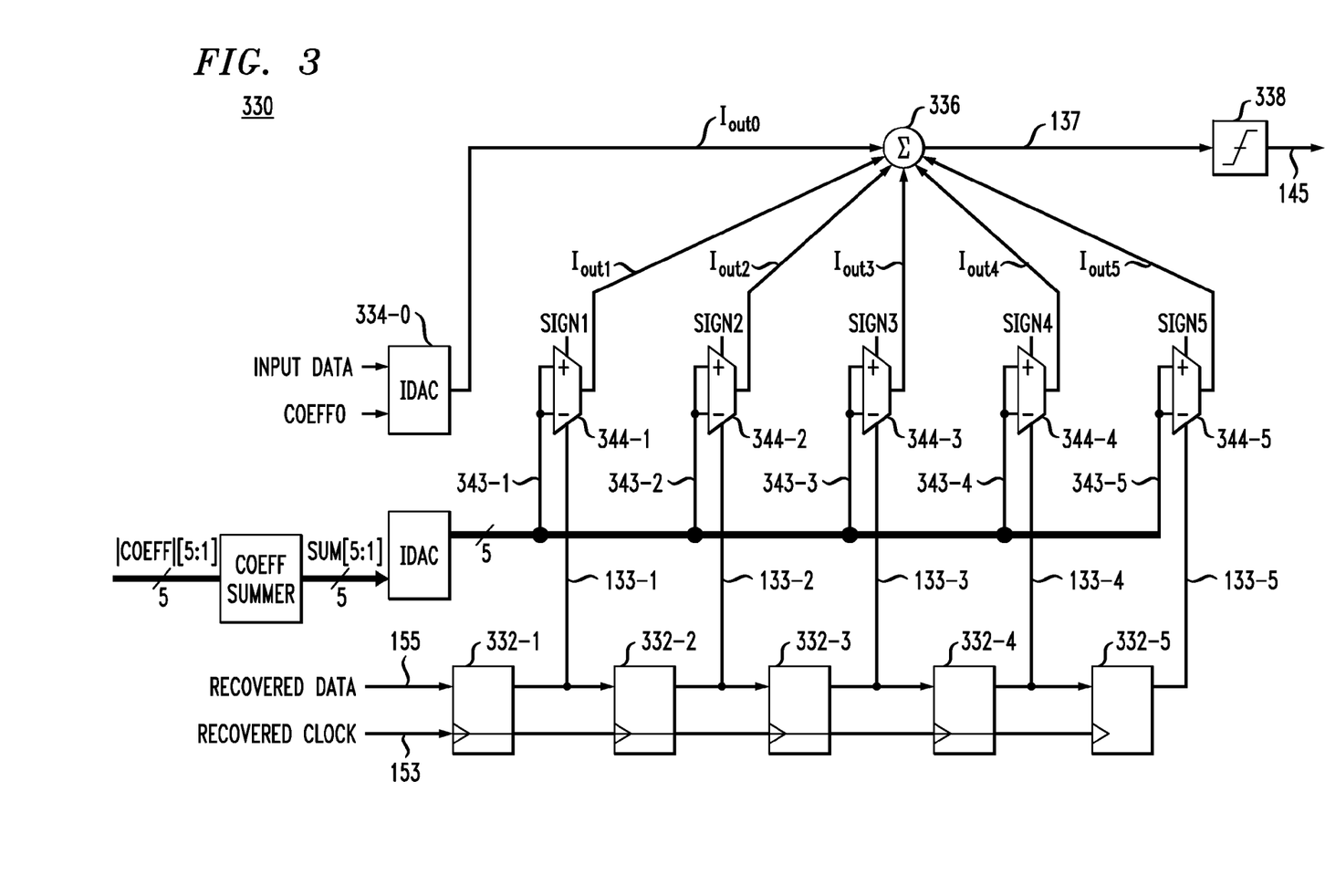
FIG. 3 shows a DFE equalizer according to one embodiment of the present invention that can be used to implement the DFE equalizer of FIG. 1.

FIG. 3 shows a DFE equalizer 330 according to one embodiment of the present invention that can be used to implement DFE equalizer 130 of FIG. 1. In FIG. 3, delay flip-flops 332-1 to 332-5, initial IDAC 334-0, muxes 344-1 to 344-5, summation node 336, and slicer 338 are substantially identical in functionality to the corresponding elements in DFE equalizer 230 of FIG. 2. However, unlike DFE equalizer 230 of FIG. 2, which has a dedicated IDAC 242-i for each additional amplifier stage 234-i, in DFE equalizer 330, the five additional amplifier stages (not labeled in FIG. 3) all share a single IDAC 342. As shown below in the context of FIGS. 5 and 6, the five additional amplifier stages of DFE equalizer 330 all share a single array 550 of current mirror cells 560 that are used to implement the five additional IDAC functions of DFE equalizer 330.

In particular, instead of five independent amplifier stages, each having a dedicated IDAC, DFE equalizer 330 has coefficient summer 340 and a shared IDAC 342. Coefficient summer 340 receives the magnitudes of the five (e.g., 8-bit) coefficient values COEFF1-COEFF5 and generates five (e.g., 8-bit) sum values SUM1-SUM5 that are applied to shared IDAC 342, according to the following formulae of Equations (1)-(5):

$$SUM1 = |COEFF1| \quad (1)$$

$$SUM2 = SUM1 + |COEFF2| + 1 \quad (2)$$

$$SUM3 = SUM2 + |COEFF3| + 1 \quad (3)$$

$$SUM4 = SUM3 + |COEFF4| + 1 \quad (4)$$

$$SUM5 = SUM4 + |COEFF5| + 1 \quad (5)$$

For example, for coefficient values:
 |COEFF1|=123
 |COEFF2|=31
 |COEFF3|=13
 |COEFF4|=1
 |COEFF5|=0,
coefficient summer 340 generates the following five sum values:
 SUM1=123
 SUM2=155
 SUM3=169
 SUM4=171
 SUM5=172.

IDAC 342 receives the five sum values SUM1-SUM5 and generates five different current signals 343-1 to 343-5, one for each of the different, additional IDAC functions performed in DFE equalizer 330. These five current signals 343-1 to 343-5 are applied in parallel as inputs to the five muxes 344-1 to 344-5, which operate analogously to muxes 244-1 to 244-5 of FIG. 2 to generate the five additional current signals Iout1-Iout5.

Figure 4:
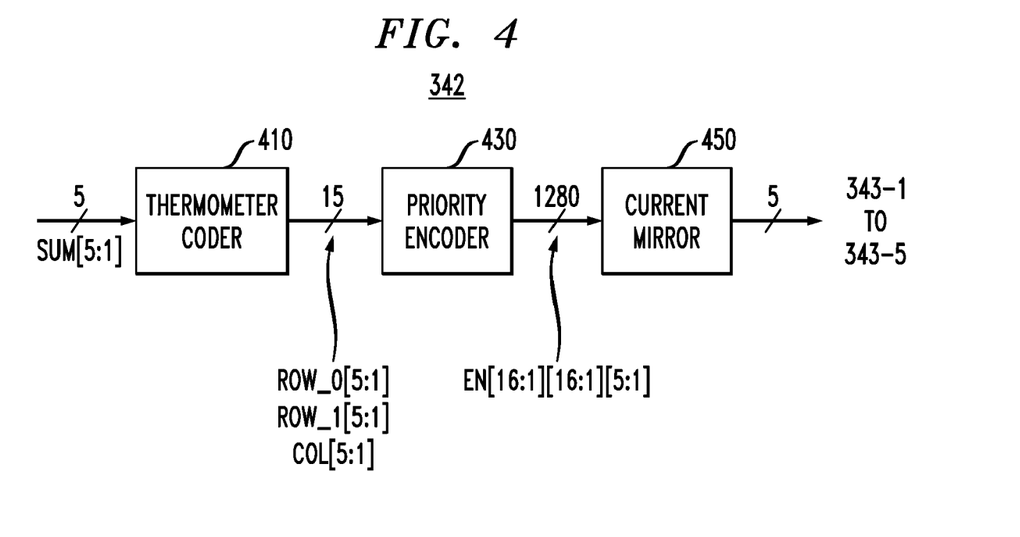
FIG. 4 shows a block diagram of the shared IDAC of FIG. 3.
Figure 5:
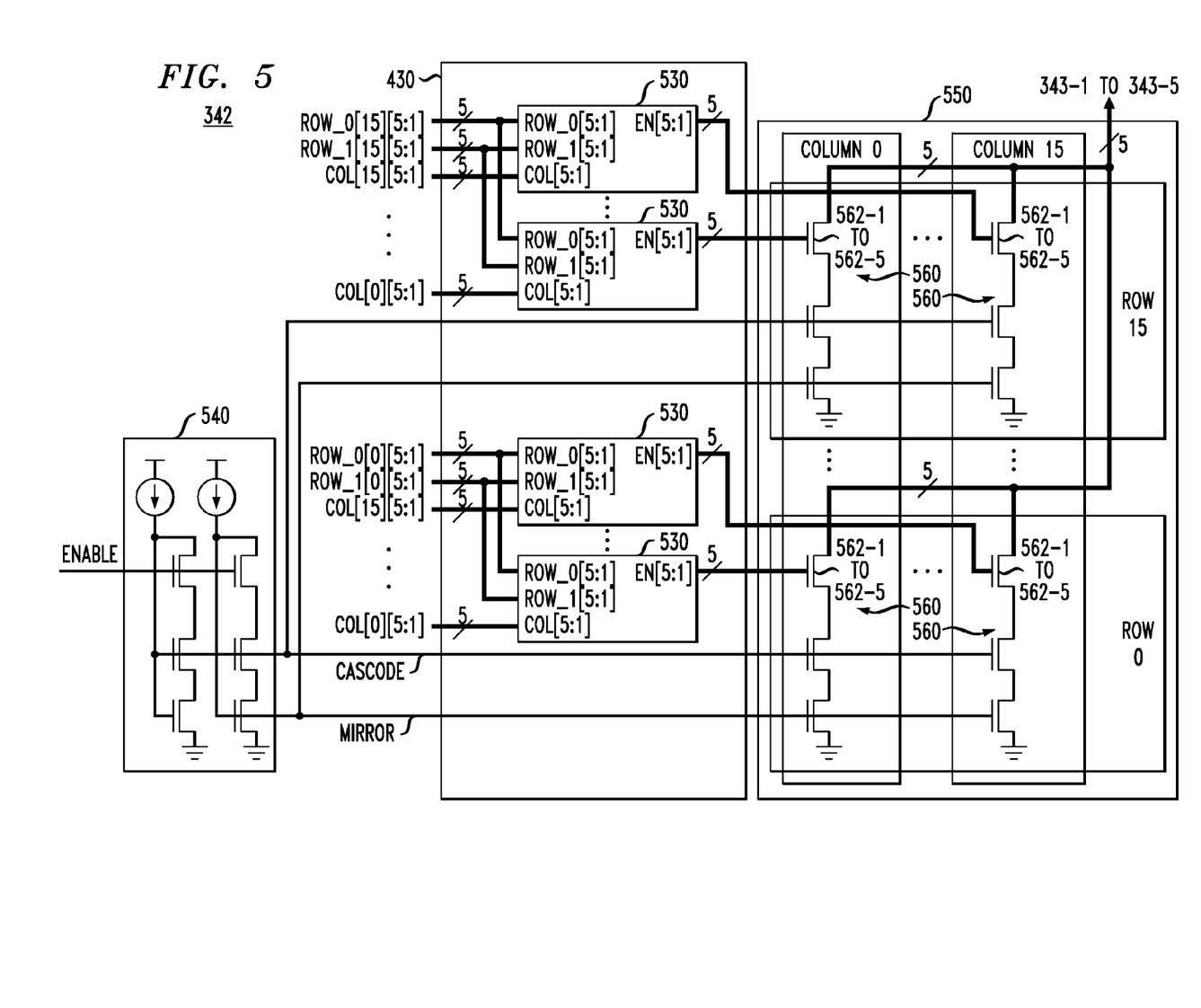
FIG. 5 shows a schematic diagram of the portion of the shared IDAC of FIG. 3 corresponding to the priority encoder and the current mirror of FIG. 4.

FIG. 4 shows a block diagram of shared IDAC 342 of FIG. 3. IDAC 342 receives the five sum values SUM[5:1] generated by coefficient summer 340 and generates the five current signals 343-1 to 343-5 applied in parallel to muxes 344-1 to 344-5 of FIG. 3. As shown in FIG. 5, IDAC 342 includes thermometer coder 410, priority encoder 430, and current mirror 450. As described in further detail below in the context of FIGS. 5 and 6, in an exemplary embodiment of FIG. 4, current mirror 450 has a (16×16) 256-bit current mirror array (550 in FIG. 5) having 256 current mirror cells (560 in FIG. 5), one for each bit in the array and arranged in 16 rows and 16 columns.

Thermometer coder 410 converts the five sum values SUM[5:1] into fifteen 16-bit thermometer code values ROW_0[5:1], ROW_1[5:1], and COL[5:1] according to the following formulae of Equations (6)-(8):

$$ROW\_0[i] = \text{thermometer}\,(SUMi/16) \quad (6)$$

$$ROW\_1[i] = \text{right\_shift}\,(ROW\_0[i]) \quad (7)$$

$$COL[i] = \text{thermometer}\,(SUMi\%16) \quad (8)$$

where i=1, . . . , 5. The function "thermometer" converts an applied value to thermometer representation. For example, the decimal value 0 is equal to [0000000000000001] in 16-bit thermometer representation, the decimal value 1 is equal to [0000000000000011] in 16-bit thermometer representation, and so on to the decimal value 15, which is equal to [1111111111111111] in 16-bit thermometer representation. The function "right_shift" shifts the applied binary value one bit to the right. For example, right_shift ([0000000000000001]=[0000000000000000], and right_shift [1111111111111111]=[0111111111111111]. The function "/" performs integer division, and the function "%" is the modulo function, which returns the remainder from a corresponding integer division operation.

For example, for sum values:
SUM1=123
SUM2=155
SUM3=169
SUM4=171
SUM5=172,
thermometer coder 410 generates the following fifteen thermometer code values:

ROW_0[1]=thermometer(123/16)=thermometer(7)=
    [0000000011111111]

ROW_1[1]=right_shift([0000000011111111])=
    [0000000001111111]

COL[1]=thermometer(123%16)=thermometer(11)=
    [0000111111111111]

ROW_0[2]=thermometer(155/16)=thermometer(9)=
    [0000001111111111]

ROW_1[2]=right_shift([0000001111111111])=
    [0000000111111111]

COL[2]=thermometer(155%16)=thermometer(11)=
    [0000111111111111]

ROW_0[3]=thermometer(169/16)=thermometer(10)=
    [0000011111111111]

ROW_1[3]=right_shift([0000011111111111])=
    [0000001111111111]

COL[3]=thermometer(169%16)=thermometer(9)=
    [0000001111111111]

ROW_0[4]=thermometer(171/16)=thermometer(10)=
    [0000011111111111]

ROW_1[4]=right_shift([0000011111111111])=
    [0000001111111111]

COL[4]=thermometer(171%16)=thermometer(11)=
    [0000111111111111]

ROW_0[5]=thermometer(172/16)=thermometer(10)=
    [0000011111111111]

ROW_1[5]=right_shift([0000011111111111])=
    [0000001111111111]

COL[5]=thermometer(172%16)=thermometer(12)=
    [0001111111111111]

Priority encoder 430 receives and converts the fifteen 16-bit thermometer code values generated by thermometer coder 410 into 1280 switch control signals EN[16:1][16:1][5:1], five switch control signals for each bit in the (16×16) 256-bit current mirror array of current mirror 450. The logic used to generate the switch enable signals is explained in further detail below in connection with FIG. 6.

Current mirror 450 receives the 1280 switch control signals EN from priority encoder 430 and generates the five current signals 343-1 to 343-5 that are applied to muxes 344-1 to 344-5.

FIG. 5 shows a schematic diagram of the portion of shared IDAC 342 of FIG. 3 corresponding to priority encoder 430 and current mirror 450 of FIG. 4. As represented in FIG. 5, current mirror 450 of FIG. 4 includes current mirror bias generator 540 and (16×16) 256-bit current mirror array 550, where each different bit is associated with a corresponding current mirror cell 560. Priority encoder 430 includes 256 priority encoder blocks 530, one for each current mirror cell 560 in current mirror array 550. In particular, each of the 256 priority encoder blocks 530 generates a corresponding set of five switch control signals EN[5:1] that control the five transistor-based switches 562-1 to 562-5 in the corresponding current mirror cell 560.

The size of the current mirror array is dictated by the number of bits used in the thermometer coding scheme. In alternative implementations, larger or smaller current mirror arrays are possible accompanied by correspondingly greater or fewer numbers of bits in the thermometer coding scheme.

Current mirror array 550 is arranged in 16 rows and 16 columns of current mirror cells 560. If the parameter j represents the row number from 0 to 15 and if the parameter k represents the column number from 0 to 15, then the priority encoder block 530 for the current mirror cell 560 located at row j and column k of current mirror array 550 processes the jth bits of the five thermometer codes ROW_0[5:1], the jth bits of the five thermometer codes ROW_1[5:1], and the kth bits of the five thermometer codes COL[5:1] (i.e., one appropriate bit from each of the fifteen thermometer codes) to generate the five switch control signals EN[5:1] for the five switches 562-1 to 562-5 in that current mirror cell 560. Each current mirror cell 560 in current mirror array 550 generates five different current signals, one for each of the five different IDAC functions implemented for DFE equalizer 330 of FIG. 3. For each different IDAC function, the 256 corresponding current signals from the 256 different current mirror cells 560 in current mirror array 550 are combined to generate a single current signal 343-$i$ that is applied to the corresponding mux 344-$i$ of FIG. 3.

Figure 6:
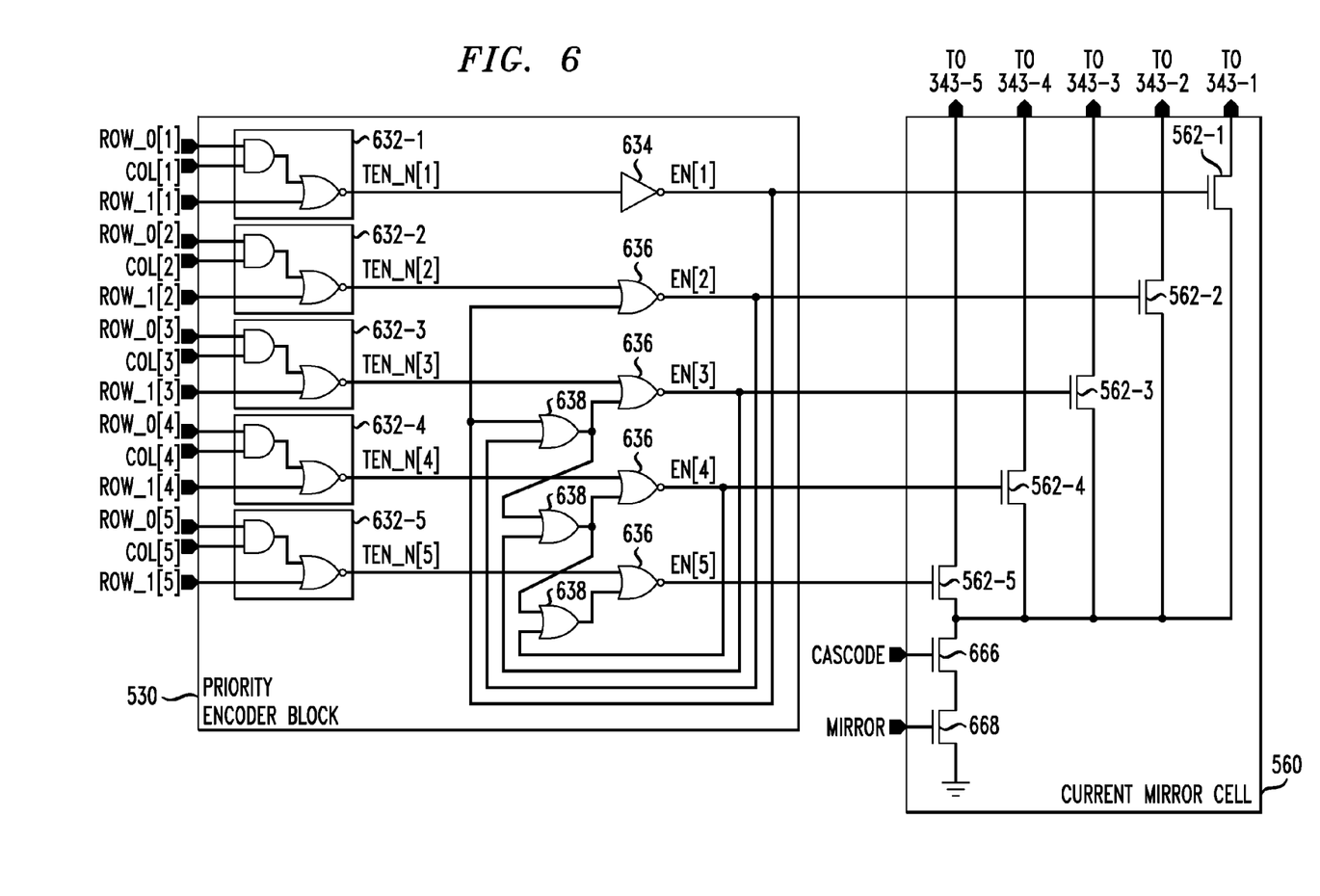
FIG. 6 shows a block diagram of a portion of the priority encoder and the current mirror of FIG. 4 corresponding to a single bit of the current mirror array of FIG. 5.

FIG. 6 shows a block diagram of a portion of priority encoder 430 and current mirror 450 of FIG. 4 corresponding to a single bit of current mirror array 550 of FIG. 5. In particular, FIG. 6 shows one of the 256 priority encoder blocks 530 of FIG. 5 and its corresponding current mirror cell 560, also referred to as a unit-cell.

As shown in FIG. 6, priority encoder block 530 has digital logic circuitry designed to implement logical operations referred to above for priority encoder 430 of FIG. 4 to generate five switch control signals EN[5:1]. Priority encoding is designed such that, at most, only one of the five switch control signals EN[5:1] can be high at one time. All five switch control signals EN[5:1] can be low at one time, but no more than one can be high at one time.

In the embodiment of FIG. 6, the initial set of five "and-or-invert" gates 632-$i$ generate five "trial" enable signals TEN_N[i] according to the following general formula of Equation (9):

$$\text{TEN\_}N[i]=!((\text{ROW\_}0[i]\&\&\text{COL}[i])\|\text{ROW\_}1[i]), \qquad (9)$$

where i=1-5, "_N" in TEN_N signifies that the trial enable signals are active low, "&&" represents the logical "and" operation, "||" represents the logical "or" operation, and "!" represents the logical "not" operation. The following Table II provides a truth table for the initial set of gates 632-$i$ of priority encoder block 530. The logic of Equation (9) and Table II for the thermometer coding of the current mirror array deals with all previous rows (i.e., ROW_1[i]) by enabling them, and the current row (i.e., ROW_0[i]) by detecting whether or not the column (i.e., COL[i]) is also enabled.

TABLE II

INITIAL GATE LOGIC

| ROW 1[i] | ROW 0[i] | COL[i] | TEN N[i] |
|---|---|---|---|
| 0 | 0 | 0 | 1 |
| 0 | 0 | 1 | 1 |
| 0 | 1 | 0 | 1 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

The remaining logic in priority encoder block 530 corresponding to gates 634-638 performs the following logical operations:

$$EN[1] = !(TEN\_N[1]) \quad (10)$$

$$EN[2] = !(TEN\_N[2]) \,\&\&\, !(EN[1]) \quad (11)$$

$$EN[3] = !(TEN\_N[3]) \,\&\&\, !(EN[2] \,||\, EN[1]) \quad (12)$$

$$EN[4] = !(TEN\_N[4]) \,\&\&\, !(EN[3] \,||\, EN[2] \,||\, EN[1]) \quad (13)$$

$$EN[5] = !(TEN\_N[5]) \,\&\&\, !(EN[4] \,||\, EN[3] \,||\, EN[2] \,||\, EN[1]) \quad (14)$$

Table III shows a truth table corresponding to this remaining logic of priority encoder block 530, where "**" indicates a value of either 0 or 1.

TABLE III

REMAINING GATE LOGIC

| TEN N[1] | TEN N[2] | TEN N[3] | TEN N[4] | TEN N[5] | EN [1] | EN [2] | EN [3] | EN [4] | EN [5] |
|---|---|---|---|---|---|---|---|---|---|
| 0 | ** | ** | ** | ** | 1 | 0 | 0 | 0 | 0 |
| 1 | 0 | ** | ** | ** | 0 | 1 | 0 | 0 | 0 |
| 1 | 1 | 0 | ** | ** | 0 | 0 | 1 | 0 | 0 |
| 1 | 1 | 1 | 0 | ** | 0 | 0 | 0 | 1 | 0 |
| 1 | 1 | 1 | 1 | 0 | 0 | 0 | 0 | 0 | 1 |
| 1 | 1 | 1 | 1 | 1 | 0 | 0 | 0 | 0 | 0 |

The logical operations of priority encoder block 530 are designed to ensure that the lower-addressed coefficients (e.g., COEFF1) take precedence over the higher-addressed coefficients (e.g., COEFF2-COEFF5). The coefficients, having been converted to a set of SUM values, address sections of the IDAC array that are overlapping. The thermometer coding addresses every bit up to the addressed value. In order to divert the proper current to the correct current mirror cell leg, the priority encoder gives precedence to the first coefficient COEFF1, next to the second coefficient COEFF2, and so on. For example, when SUM1=123 and SUM2=155, both COEFF1 and COEFF2, via SUM1 and SUM2, address the same bits between 0 and 123. As such, the priority encoder gives priority to COEFF1 over COEFF2.

As also shown in FIG. 6, current mirror cell 560 has (i) five transistor-based switches 562-1 to 562-5 that are respectively part of five different cell legs 664-1 to 664-5 and (ii) a single pair of transistor-based cascode and mirror devices 666 and 668, which mirror the current generated by current mirror bias generator 540 of FIG. 5. Each switch 562-*i* is controlled by a corresponding switch control signal EN[i] generated by priority encoder block 530. If switch control signal EN[i] is high, then switch 562-*i* is turned on and the current through current mirror devices 666 and 668. If one of the switch control signals is high, then the other four are low. As such, one of the switches is turned on (i.e., closed) and the other four switches are turned off (i.e., open), and the current through current mirror devices 666 and 668 is directed out the leg corresponding to the closed switch.

As a result of using thermometer coding, all of the cells 560 in current mirror array 550 are designed to contribute the same amount of current. As such, current mirror devices 666 are typically the same size for each current mirror cell 560, and current mirror devices 668 are typically the same size for each current mirror cell 560, although the size of devices 666 may differ from the size of devices 668.

In an analogous conventional implementation, such as that of FIG. 2, each additional IDAC 242-*i* would have its own dedicated 256-bit current mirror array, where each bit of each array would have a single switch and its own pair of current mirror devices analogous to current mirror devices 666 and 668. Such an implementation would require five times as many current mirror devices as is needed in DFE equalizer 330 of FIG. 3, which corresponds to a significant savings in chip area for the present invention, even taking into account the additional circuitry required for coefficient summer 340 and the additional logic in priority encoder 430. Note that a thermometer-code-based implementation of DFE equalizer 230 of FIG. 2 would include the five AND gates and five NOR gates shown on the left side of FIG. 6, but not the rest of the logic circuitry shown for priority encoder block 530, which is the additional logic for this embodiment of the present invention.

In FIG. 6, current mirror cell 560 may be said to receive a cell input signal corresponding to the appropriate bits of thermometer code values ROW_0, ROW_1, and COL, which are generated based on IDAC input signals corresponding to coefficient values COEFF1-COEFF5. Current mirror cell 560 may be further said to generate a cell output signal corresponding to the leg 664-*i* (if any) of current mirror cell 560 that is selected by the switch circuitry formed by switches 562-1 to 562-5.

Although the present invention has been described in the context of a DFE equalizer having six coefficients COEFF0-COEFF5, those skilled in the art will understand that the present invention can be implemented in the context of DFE equalizers having other numbers (i.e., N+1) of coefficients, where the initial coefficient COEFF0 is associated with a dedicated IDAC and the additional coefficients COEFF1-COEFFN share a second IDAC.

Although the present invention has been described in the context of multiple IDAC functions that share a single array of current mirror cells in the context of a DFE equalizer, those skilled in the art will understand that the present invention can be implemented in other contexts in which multiple IDAC functions share a single array of current mirror cells.

Although the present invention has been described in the context of current-mirror IDAC functions, those skilled in the art will understand that the present invention can be implemented in other contexts in which multiple non-current-mirror DAC functions share a single array of elements, instead of the single, shared array of current mirror cells for IDAC functions. For example, in one possible alternative embodiment of the present invention, an array of thermometer-code-controlled resistors could be shared to generate simultaneously multiple outputs for multiple DAC functions, where the resistors are switched to the negative input of an op-amp having a feedback resistor connected between the op-amp output and the negative input to convert resistor current to a voltage. In another possible embodiment, an array of switched capacitors could be shared by multiple DAC functions with capacitors and switches replacing the resistors of the previous embodiment.

The present invention may be implemented as (analog, digital, or a hybrid of both analog and digital) circuit based processes, including possible implementation as a single integrated circuit (such as an ASIC or an FPGA), a multi chip module, a single card, or a multi card circuit pack. As would be apparent to one skilled in the art, various functions of circuit elements may also be implemented as processing blocks in a software program. Such software may be employed in, for example, a digital signal processor, micro controller, or general purpose computer.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi polar device when the present invention is implemented using bi-polar transistor technology.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non enabled embodiments and embodiments that correspond to non statutory subject matter are explicitly disclaimed even if they fall within the scope of the claims.

What is claimed is:

1. An integrated circuit having two or more different digital-to-analog converter (DAC) functions, wherein the integrated circuit comprises a current mirror array that is shared by the two or more different DAC functions;
    the DAC functions are current DAC (IDAC) functions;
    the different IDAC functions comprise at least (i) a first IDAC function configured to receive a first non-zero IDAC input signal and generate a first non-zero IDAC output signal and (ii) a second IDAC function configured to receive a second non-zero IDAC input signal and generate a second non-zero IDAC output signal; and
    the integrated circuit is configured to generate the first and second non-zero IDAC output signals at the same time.

2. The invention of claim 1, wherein:
    the current mirror array comprises at least (i) a first current mirror cell configured to receive a first cell input signal generated based on one or both of the first and second IDAC input signals and generate a first cell output signal and (ii) a second current mirror cell configured to receive a second cell input signal generated based on one or both of the first and second IDAC input signals and generate a second cell output signal;

the first current mirror cell comprises first switch circuitry that selectively determines, based on the first cell input signal, whether the first cell output signal is (i) part of the first IDAC output signal, (ii) part of the second IDAC output signal, or (iii) part of neither the first or the second IDAC output signal; and the second current mirror cell comprises second switch circuitry that selectively determines, based on the second cell input signal, whether the second cell output signal is (i) part of the first IDAC output signal, (ii) part of the second IDAC output signal, or (iii) part of neither the first or the second IDAC output signal.

3. The invention of claim 1, wherein the integrated circuit is an FPGA.

4. An integrated circuit having two or more different digital-to-analog converter (DAC) functions, wherein the integrated circuit comprises a current mirror array that is shared by the two or more different DAC functions, wherein:
the current mirror array is part of a current mirror having a current mirror bias generator and
the current mirror array comprises a plurality of current mirror cells, each current mirror cell comprising:
one or more current mirror devices configured to mirror current generated by the current mirror bias generator; and
two or more switches connected to the one or more current mirror devices to selectively connect the mirrored current to corresponding legs of the current mirror cell.

5. The invention of claim 4, wherein the corresponding sets of legs of the plurality of current mirror cells in the current mirror array are connected to generate an output current signal for each different IDAC function.

6. The invention of claim 4, further comprising a priority encoder configured to generate switch control signals that control the two or more switches in each current mirror cell.

7. The invention of claim 6, wherein the priority encoder ensures that at most one switch in each current mirror cell is closed at one time, such that the mirrored current is connected to at most one leg of the current mirror cell at one time.

8. An integrated circuit having two or more different digital-to-analog converter (DAC) functions, wherein the integrated circuit comprises a current mirror array that is shared by the two or more different DAC functions, wherein the shared current mirror array is part of a decision feedback equalizer (DFE) configured to use the shared current mirror array to generate two or more IDAC current signals used to generate an equalized data signal.

9. The invention of claim 8, wherein the DFE equalizer is part of a serializer-deserializer (SerDes) receiver.

10. The invention of claim 9, wherein the SerDes receiver is part of a field-programmable gate array (FPGA).

11. The invention of claim 8, wherein the DFE equalizer further comprises:
an initial amplifier stage configured to generate an initial current signal; and
a summation node configured to combine the initial current signal and the two or more IDAC current signals to generate the equalized data signal.

12. The invention of claim 11, wherein the DFE equalizer further comprises a different mux for each IDAC function supported by the shared current mirror array, wherein the mux is configured to generate a corresponding IDAC current signal based on a corresponding current signal generated using the shared current mirror array, the sign of a corresponding IDAC coefficient value, and a corresponding delayed version of a recovered data signal derived based on the equalized data signal.

* * * * *